United States Patent
Yu et al.

(10) Patent No.: US 11,489,114 B2
(45) Date of Patent: Nov. 1, 2022

(54) RESISTIVE RANDOM-ACCESS MEMORY (RRAM) DEVICE AND FORMING METHOD THEREOF

(71) Applicant: UNITED MICROELECTRONICS CORP., Hsin-Chu (TW)

(72) Inventors: Shu-Hung Yu, Kaohsiung (TW); Chun-Hung Cheng, Kaohsiung (TW); Chuan-Fu Wang, Miaoli County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/211,875

(22) Filed: Mar. 25, 2021

(65) Prior Publication Data
US 2022/0271222 A1 Aug. 25, 2022

(30) Foreign Application Priority Data
Feb. 25, 2021 (CN) .......................... 202110212202.2

(51) Int. Cl.
*H01L 45/00* (2006.01)

(52) U.S. Cl.
CPC ...... *H01L 45/1233* (2013.01); *H01L 45/1253* (2013.01); *H01L 45/146* (2013.01); *H01L 45/1675* (2013.01)

(58) Field of Classification Search
CPC ............. H01L 45/1233; H01L 45/1253; H01L 45/146
See application file for complete search history.

(56) References Cited

U.S. PATENT DOCUMENTS

2019/0305218 A1* 10/2019 Trinh ...................... H01L 45/08
2021/0013407 A1* 1/2021 Xiao ...................... H01L 45/08

* cited by examiner

*Primary Examiner* — Shih Tsun A Chou
(74) *Attorney, Agent, or Firm* — Winston Hsu

(57) ABSTRACT

A resistive random-access memory (RRAM) device includes a bottom electrode, a high work function layer, a resistive material layer, a top electrode and high work function spacers. The bottom electrode, the high work function layer, the resistive material layer and the top electrode are sequentially stacked on a substrate, wherein the resistive material layer includes a bottom part and a top part. The high work function spacers cover sidewalls of the bottom part, thereby constituting a RRAM cell. The present invention also provides a method of forming a RRAM device.

14 Claims, 3 Drawing Sheets

RESISTIVE RANDOM-ACCESS MEMORY (RRAM) DEVICE AND FORMING METHOD THEREOF

BACKGROUND OF THE INVENTION

1. Field of the Invention

The present invention relates to a resistive random-access memory (RRAM) device and forming method thereof, and more particularly, to a resistive random-access memory (RRAM) device applying high work function spacers and forming method thereof.

2. Description of the Prior Art

In semiconductor processes, a resistive random-access memory is composed of two upper and lower metal electrodes and a transition metal oxide (TMO). The operating theory is to use the variable resistance of the transition metal oxide. The applied bias voltage changes to induce different resistance values, and the internal stored value is determined by the internal resistance.

SUMMARY OF THE INVENTION

The present invention provides a resistive random-access memory (RRAM) device and forming method thereof, which forms high work function spacers to cover resistive material layers, to prevent oxygen atoms in dielectric layers from diffusing into oxygen vacancies of the resistive material layers, thereby degrading of switching resistance states can being avoided.

The present invention provides a resistive random-access memory (RRAM) device including a bottom electrode, a high work function layer, a resistive material layer, a top electrode and high work function spacers. The bottom electrode, the high work function layer, the resistive material layer and the top electrode are sequentially stacked on a substrate, wherein the resistive material layer includes a bottom part and a top part. The high work function spacers cover sidewalls of the bottom part, thereby constituting a RRAM cell.

The present invention provides a method of forming a resistive random-access memory (RRAM) device including the following steps. A bottom electrode layer, a high work function material layer, a bottom resistive layer, a top resistive layer, and a top electrode layer are sequentially deposited on a substrate. The top electrode layer and the top resistive layer are patterned to form a top electrode and a top part of a resistive material layer. Spacers are formed to cover sidewalls of the top part. The bottom resistive layer, the high work function material layer and the bottom electrode layer are patterned to form a bottom part of the resistive material layer, a high work function layer and a bottom electrode. High work function spacers are formed to cover sidewalls of the bottom part, thereby constituting a RRAM cell.

According to the above, the present invention provides a resistive random-access memory (RRAM) device and forming method thereof, which forms high work function spacers to cover a resistive material layer. For example, a bottom electrode layer, a high work function material layer, a bottom resistive layer, a top resistive layer, and a top electrode layer are sequentially deposited on a substrate; the top electrode layer and the top resistive layer are patterned to forma top electrode and a top part of a resistive material layer. Spacers are formed to cover sidewalls of the top part; the bottom resistive layer, the high work function material layer and the bottom electrode layer are patterned to form a bottom part of the resistive material layer, a high work function layer and a bottom electrode; high work function spacers are formed to cover sidewalls of the bottom part, thereby constituting a RRAM cell. This prevents oxygen atoms in a dielectric layer covering the RRAM cell from diffusing into oxygen vacancies of the resistive material layer, thereby degrading of switching resistance states can being avoided.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
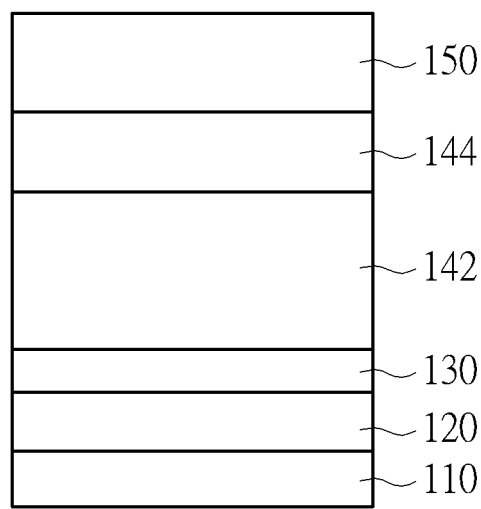
FIG. 1 schematically depicts a cross-sectional view of a method of forming a resistive random-access memory (RRAM) device according to an embodiment of the present invention.

FIGS. 1-6 schematically depict cross-sectional views of a method of forming a resistive random-access memory (RRAM) device according to an embodiment of the present invention. As shown in FIG. 1, a substrate 110 is provided, wherein the substrate 110 may be a silicon substrate, a silicon containing substrate, a III-V group-on-silicon (such as GaN-on-silicon) substrate, a silicon carbide substrate, an aluminum oxide substrate, a graphene-on-silicon substrate or a silicon-on-insulator (SOI) substrate. In this embodiment, only a resistive random-access memory area of the substrate 110 is depicted.

A bottom electrode layer 120, a high work function material layer 130, a bottom resistive layer 142, a top resistive layer 144 and a top electrode layer 150 are sequentially deposited on the substrate 110. In this embodiment, the bottom electrode layer 120 and the top electrode layer 150 may include tantalum nitride (TaN) or titanium nitride (TiN) etc, and the bottom resistive layer 142 and the top resistive layer 144 may include metal oxide layers. Preferably, the bottom resistive layer 142 and the top resistive layer 144 may include tantalum oxide or hafnium oxide. For operating the resistive random-access memory (RRAM) device with the bottom electrode layer 120 and the top electrode layer 150 being tantalum nitride (TaN) or titanium nitride (TiN) and the resistive layers being metal oxide layers, a voltage difference is forced to the RRAM cells to induce oxygen vacancies in parts of the resistive layers, so that resistance states can be switched through changing the distribution of the oxygen vacancies caused by tuning applied voltage, and thus the resistive random-access memory (RRAM) device can be written or erased. In this case, the high work function material layer 130 includes Iridium (Ir), the bottom resistive layer 142 and the top resistive layer 144 include tantalum oxide, and the bottom electrode layer 120 and the top electrode layer 150 include tantalum nitride (TaN), but it is not limited thereto. In a preferred embodiment, the bottom resistive layer 142 is a Ta2O5 layer and the top resistive layer 144 is a tantalum oxide (TaOx) layer, to form the bottom resistive layer 142 with oxygen vacancies after voltage difference is applied to the RRAM cells.

Figure 2:
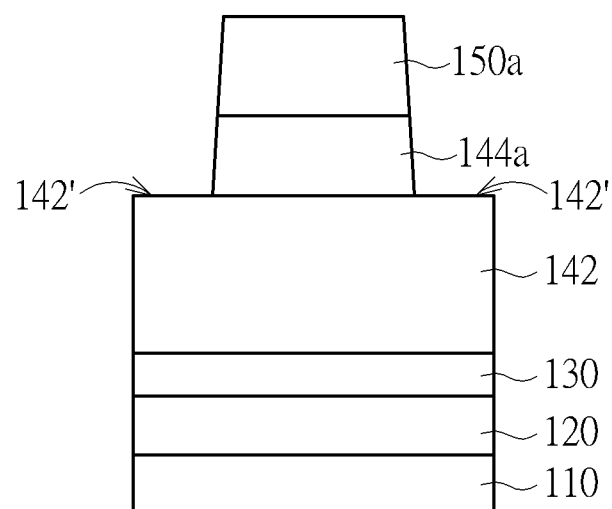
FIG. 2 schematically depicts a cross-sectional view of a method of forming a resistive random-access memory (RRAM) device according to an embodiment of the present invention.

As shown in FIG. 2, the top electrode layer 150 and the top resistive layer 144 are patterned to form a top electrode 150a and a top part 144a, and to expose parts 142' of the bottom resistive layer 142. In this embodiment, the top part 144a and the top electrode 150a constitute a trapezoidal shape cross-sectional profile, but it is not limited thereto. In other embodiments, the top part 144a and the top electrode 150a may have a step-shape cross-sectional profile.

Figure 3:
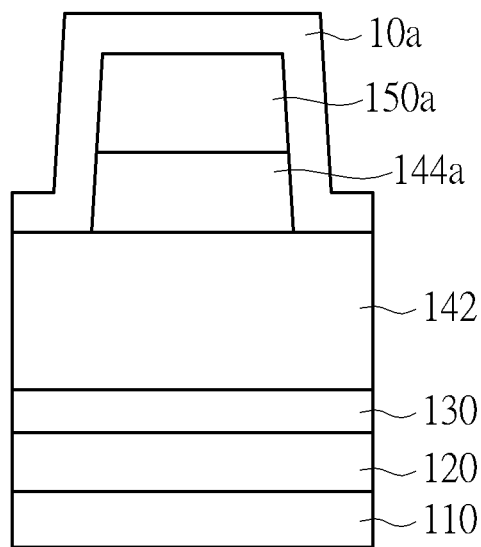
FIG. 3 schematically depicts a cross-sectional view of a method of forming a resistive random-access memory (RRAM) device according to an embodiment of the present invention.
Figure 4:
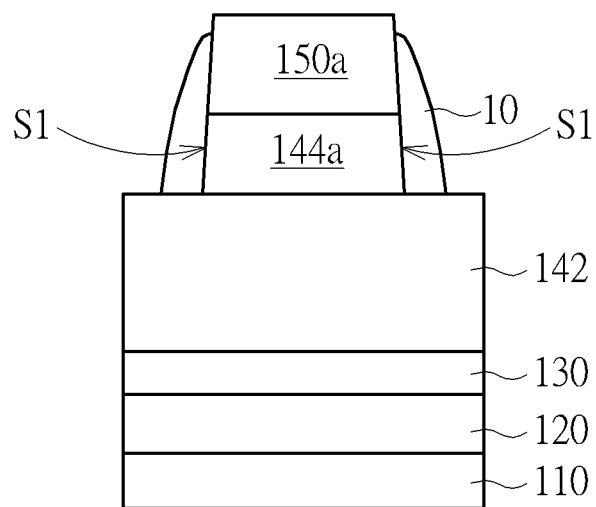
FIG. 4 schematically depicts a cross-sectional view of a method of forming a resistive random-access memory (RRAM) device according to an embodiment of the present invention.
Figure 5:
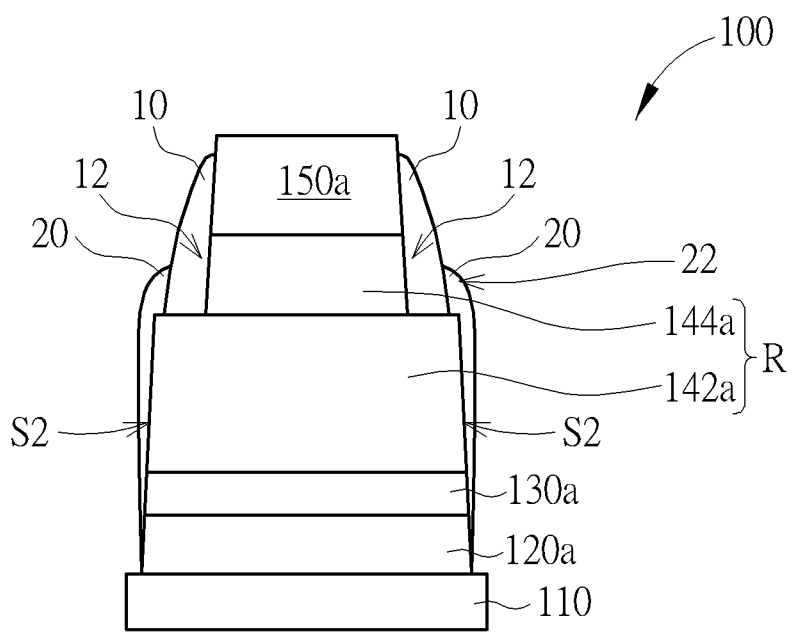
FIG. 5 schematically depicts a cross-sectional view of a method of forming a resistive random-access memory (RRAM) device according to an embodiment of the present invention.

Please refer to FIGS. 3-4, spacers 10 are formed to cover sidewalls S1 of the top part 144a, to avoid above conductive structures from contacting to the top part 144a and make short circuit occur. In a preferred embodiment, the spacers 10 may be silicon nitride spacers, but it is not limited thereto. As shown in FIG. 3, a spacer material layer 10a is deposited to conformally cover the bottom resistive layer 142, the top part 144a and the top electrode 150a. Then, the spacer material layer 10a is etched to form the spacers 10. In this case, the spacers 10 overlap and cover parts of the top electrode 150a to ensure the top part 144a is isolated by the spacers 10, but the present invention is not restricted thereto.

Thereafter, the bottom resistive layer 142, the high work function material layer 130 and the bottom electrode layer 120 are patterned to form a bottom part 142a, a high work function layer 130a and a bottom electrode 120a. Thus, the bottom part 142a and the top part 144a constitute a resistive material layer R. In this case, the bottom electrode 120a, the high work function layer 130a and the bottom part 142a constitute a trapezoidal shape cross-sectional profile, but it is not limited thereto. In another case, the bottom electrode 120a, the high work function layer 130a and the bottom part 142a have a step-shape cross-sectional profile. Or, the bottom electrode 120a, the high work function layer 130a, the resistive material layer R and the top electrode 150a all have trapezoidal shape cross-sectional profiles, depending upon practical requirements.

High work function spacers 20 are formed to cover sidewalls S2 of the bottom part 142a of the resistive material layer R, thereby constituting a RRAM cell 100. In this embodiment, the high work function spacers 20 include Iridium (Ir), but it is not limited thereto. Since the high work function spacers 20 are formed on the sidewalls S2 of the bottom part 142a of the resistive material layer R, this prevents oxygen atoms in a dielectric layer covering the RRAM cell 100 from diffusing into oxygen vacancies of the bottom part 142a, thereby degrading of switching resistance states can being avoided.

In a preferred embodiment, the bottom resistive layer 142, the high work function material layer 130 and the bottom electrode layer 120 are patterned and the high work function spacers 20 are formed in-situ, to avoid device pollution while performing processes and improve processing efficiency. In a still preferred embodiment, the high work function spacers 20 are formed by re-sputtering the high work function material layer 130 while the bottom resistive layer 142, the high work function material layer 130 and the bottom electrode layer 120 are etched while patterning. In this way, the high work function material layer 130 and the high work function spacers 20 have common materials such as Iridium (Ir) in this case. In this embodiment, the high work function spacers 20 directly stand on the high work function layer 130a by re-sputtering. Besides, the spacers 10 directly stand on the bottom parts 142a of the resistive material layer R. Furthermore, top parts 22 of the high work function spacers 20 overlap bottom parts 12 of the spacers 10, so that the resistive material layer R, especially for the bottom part 142a of the resistive material layer R, is not exposed.

Figure 6:
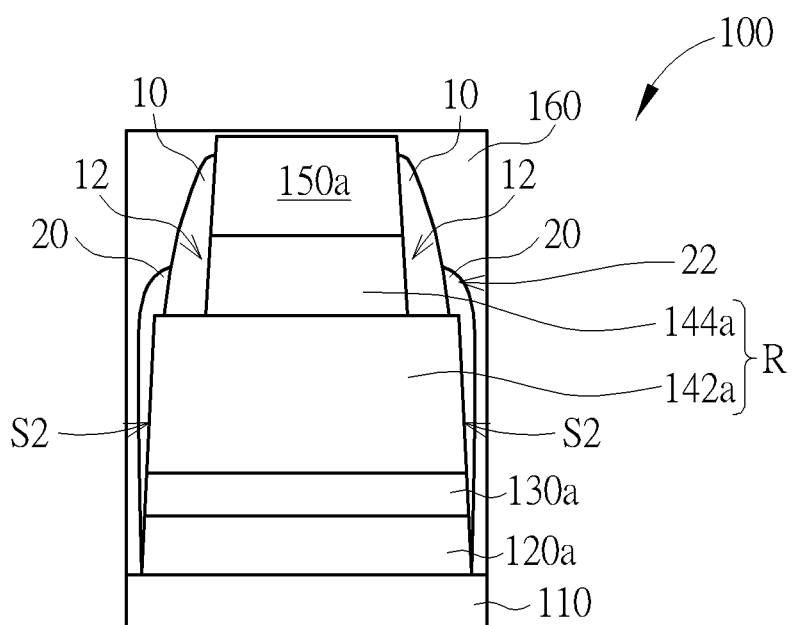
FIG. 6 schematically depicts a cross-sectional view of a method of forming a resistive random-access memory (RRAM) device according to an embodiment of the present invention.

As shown in FIG. 6, an inter-dielectric layer 160 is formed to blanketly cover the RRAM cell R. The inter-dielectric layer 160 may be an oxide layer. Oxygen atoms in the inter-dielectric layer 160 cannot diffuse to the bottom part 142a of the resistive material layer R by disposing the high work function spacers 20. Then, a voltage difference is forced to the RRAM cell 100 to form an oxygen vacancy part in the bottom part 142a for operating the RRAM cell 100.

To summarize, the present invention provides a resistive random-access memory (RRAM) device and forming method thereof, which forms high work function spacers to cover a resistive material layer, to prevent oxygen atoms in a dielectric layer covering the RRAM cell from diffusing into oxygen vacancies of the resistive material layer, thereby degrading of switching resistance states can being avoided. For example, a bottom electrode layer, a high work function material layer, a bottom resistive layer, a top resistive layer, and a top electrode layer are sequentially deposited on a substrate; the top electrode layer and the top resistive layer are patterned to form a top electrode and a top part of a resistive material layer. Spacers are formed to cover sidewalls of the top part; the bottom resistive layer, the high work function material layer and the bottom electrode layer are patterned to form a bottom part of the resistive material layer, a high work function layer and a bottom electrode; high work function spacers are formed to cover sidewalls of the bottom part, thereby constituting a RRAM cell.

Preferably, the bottom resistive layer, the high work function material layer and the bottom electrode layer are patterned and the high work function spacers are formed in-situ. Still Preferably, the high work function spacers are formed by re-sputtering the high work function material layer while the bottom resistive layer, the high work function material layer and the bottom electrode layer are etched while patterning.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistive random-access memory (RRAM) device, comprising:
    a bottom electrode, a work function layer, a resistive material layer and a top electrode sequentially stacked on a substrate, wherein the resistive material layer comprises a bottom part and a top part; and work function spacers covering sidewalls of the bottom part, thereby constituting a RRAM cell.

2. The resistive random-access memory (RRAM) device according to claim 1, wherein the bottom electrode and the top electrode comprise tantalum nitride (TaN) or titanium nitride (TiN).

3. The resistive random-access memory (RRAM) device according to claim 1, wherein the bottom electrode, the work function layer, the resistive material layer and the top electrode all have trapezoidal shape cross-sectional profiles.

4. The resistive random-access memory (RRAM) device according to claim 1, wherein the bottom electrode, the work function layer and the bottom part constitute one trapezoidal shape cross-sectional profile, and the top part and the top electrode constitute the other trapezoidal shape cross-sectional profile.

5. The resistive random-access memory (RRAM) device according to claim 1, wherein resistive material layer comprises a metal oxide layer.

6. The resistive random-access memory (RRAM) device according to claim 5, wherein the metal oxide layer comprises tantalum oxide or hafnium oxide.

7. The resistive random-access memory (RRAM) device according to claim 1, wherein the work function layer and the work function spacers comprise common materials.

8. The resistive random-access memory (RRAM) device according to claim 7, wherein the work function layer and the work function spacers comprise Iridium (Ir).

9. The resistive random-access memory (RRAM) device according to claim 1, further comprising:
   spacers covering sidewalls of the top part and the top electrode.

10. The resistive random-access memory (RRAM) device according to claim 9, wherein the spacers covering sidewalls of the top part and the top electrode comprise silicon nitride spacers.

11. The resistive random-access memory (RRAM) device according to claim 9, wherein tops of the work function spacers overlap bottoms of the spacers covering sidewalls of the top part and the top electrode.

12. The resistive random-access memory (RRAM) device according to claim 9, wherein the spacers covering sidewalls of the top part and the top electrode directly stand on the bottom part of the resistive material layer.

13. The resistive random-access memory (RRAM) device according to claim 1, wherein the work function spacers directly stand on the work function layer.

14. The resistive random-access memory (RRAM) device according to claim 1, further comprising:
   an inter-dielectric layer blanketly covering the RRAM cell.

* * * * *